United States Patent
Menard

(10) Patent No.: US 11,462,624 B2
(45) Date of Patent: Oct. 4, 2022

(54) SEMICONDUCTOR TRIODE

(71) Applicant: STMICROELECTRONICS (TOURS) SAS, Tours (FR)

(72) Inventor: Samuel Menard, Les Taillades (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 16/230,137

(22) Filed: Dec. 21, 2018

(65) Prior Publication Data
US 2019/0214476 A1   Jul. 11, 2019

(30) Foreign Application Priority Data
Jan. 5, 2018 (FR) ...................... 1850084

(51) Int. Cl.
| | | |
|---|---|---|
| H01L 29/00 | (2006.01) | |
| H01L 29/47 | (2006.01) | |
| H01L 29/73 | (2006.01) | |
| H01L 29/747 | (2006.01) | |
| H01L 29/74 | (2006.01) | |
| H01L 29/732 | (2006.01) | |
| H01L 29/417 | (2006.01) | |
| H01L 29/45 | (2006.01) | |

(52) U.S. Cl.
CPC ........ *H01L 29/47* (2013.01); *H01L 29/41708* (2013.01); *H01L 29/732* (2013.01); *H01L 29/7308* (2013.01); *H01L 29/74* (2013.01); *H01L 29/747* (2013.01); *H01L 29/456* (2013.01)

(58) Field of Classification Search
CPC ......... H01L 29/41708; H01L 29/41716; H01L 29/7308; H01L 29/74; H01L 29/747
See application file for complete search history.

(56) References Cited

U.S. PATENT DOCUMENTS

| | | | |
|---|---|---|---|
| 3,829,880 A | 8/1974 | Krishna | |
| 5,093,705 A * | 3/1992 | Voss | ..... H01L 29/1016 257/129 |
| 5,883,401 A | 3/1999 | Pezzani | |
| 5,998,813 A | 12/1999 | Bernier | |
| 6,034,381 A | 3/2000 | Pezzani | |
| 6,049,096 A | 4/2000 | Bernier | |
| 6,323,718 B1 | 11/2001 | Rault et al. | |
| 6,380,565 B1 | 4/2002 | Duclos et al. | |
| 6,593,600 B1 | 7/2003 | Duclos et al. | |

(Continued)

FOREIGN PATENT DOCUMENTS

| | | |
|---|---|---|
| EP | 0 107 773 A1 | 9/1983 |
| EP | 1076366 A1 | 2/2001 |

(Continued)

OTHER PUBLICATIONS

Hadley, "Exam Mar. 2007, Problem 3", Graz University of Technology (Year: 2007).*

(Continued)

*Primary Examiner* — Mounir S Amer
*Assistant Examiner* — Alexander Belousov
(74) *Attorney, Agent, or Firm* — Seed IP Law Group LLP

(57) ABSTRACT

A vertical semiconductor triode includes a first layer of semiconductor material, the first layer including first and second surfaces, the first surface being in contact with a first electrode forming a Schottky contact.

20 Claims, 4 Drawing Sheets

(56) References Cited

U.S. PATENT DOCUMENTS

| | | | |
|---|---|---|---|
| 6,818,927 B2 | 11/2004 | Simonnet | |
| 7,851,274 B1* | 12/2010 | Shah | H01L 29/744 438/139 |
| 8,785,970 B2* | 7/2014 | Menard | H01L 29/1012 257/155 |
| 8,901,601 B2* | 12/2014 | Menard | H01L 29/0649 257/119 |
| 8,912,566 B2* | 12/2014 | Hague | H01L 29/747 257/119 |
| 9,437,722 B2* | 9/2016 | Menard | H01L 29/747 |
| 9,455,253 B2* | 9/2016 | Menard | H01L 23/528 |
| 9,722,061 B2* | 8/2017 | Menard | H01L 29/0638 |
| 9,755,541 B2* | 9/2017 | Gonthier | H02M 7/162 |
| 9,774,243 B2* | 9/2017 | Gonthier | H02M 7/062 |
| 10,014,797 B2* | 7/2018 | Gonthier | H02M 1/081 |
| 2002/0008247 A1 | 1/2002 | Galtie et al. | |
| 2003/0122211 A1 | 7/2003 | Ladiray | |
| 2004/0026711 A1 | 2/2004 | Gimonet et al. | |
| 2004/0135170 A1 | 7/2004 | Menard | |
| 2005/0017263 A1 | 1/2005 | Simmonet | |
| 2005/0245006 A1 | 11/2005 | Tseng | |
| 2005/0269660 A1* | 12/2005 | Singh | H01L 29/7392 257/492 |
| 2006/0125055 A1 | 6/2006 | Menard | |
| 2011/0284921 A1 | 11/2011 | Menard | |
| 2013/0049065 A1 | 2/2013 | Menard | |
| 2013/0105855 A1* | 5/2013 | Hague | H01L 29/747 257/119 |
| 2014/0001514 A1* | 1/2014 | Schulze | H01L 29/0878 257/190 |
| 2014/0110751 A1 | 4/2014 | Chang et al. | |
| 2015/0108537 A1* | 4/2015 | Menard | H01L 29/32 257/119 |
| 2016/0027774 A1* | 1/2016 | Menard | H01L 27/0817 257/119 |
| 2016/0027907 A1* | 1/2016 | Menard | H01L 29/0638 257/119 |
| 2016/0301298 A1* | 10/2016 | Gonthier | H02M 1/32 |
| 2016/0301326 A1* | 10/2016 | Gonthier | H02M 7/062 |
| 2016/0373021 A1* | 12/2016 | Gonthier | H02M 1/32 |
| 2017/0271490 A1* | 9/2017 | Ogura | H01L 29/36 |
| 2017/0324350 A1* | 11/2017 | Gonthier | H02M 7/062 |
| 2019/0214476 A1* | 7/2019 | Menard | H01L 29/47 |
| 2020/0202918 A1* | 6/2020 | Le | H01L 21/8229 |

FOREIGN PATENT DOCUMENTS

| | | |
|---|---|---|
| EP | 1324394 A1 | 7/2003 |
| EP | 1672699 A1 | 6/2006 |
| FR | 2664741 A1 | 1/1992 |
| FR | 2895600 A1 | 6/2007 |
| JP | 5-136015 A | 6/1993 |
| WO | 02/50915 A1 | 6/2002 |
| WO | 2011/135242 A1 | 11/2011 |

OTHER PUBLICATIONS

Gupta et al., "Electrostatic Doping in Semiconductor Devices," *IEEE Transactions on Electron Devices* 20(8):3044-3055, 2017.

Sahu et al., "Design and performance projection of symmetric bipolar charge-plasma transistor on SOI," *Electronics Letters* 50(20):1461-1463, 2014.

Toulon et al., "Analysis and Optimization of a Thyristor Structure Using Backside Schottky Contacts Suited for the High Temperature," *IEEE Transactions on Electron Devices* 60(11):3814-3820, 2013.

Tung, "The physics and chemistry of the Schottky barrier height," *Applied Physics Reviews* 1:011304, 2014 (55 pages).

* cited by examiner

SEMICONDUCTOR TRIODE

BACKGROUND

Technical Field

The present disclosure concerns electronic components comprising more than one PN junction, and more particularly triodes.

Description of the Related Art

Various electronic components comprise more than one PN junction, that is, more than one contact between a P-type semiconductor material and an N-type semiconductor material.

A triode is defined as being an electronic component comprising three terminals, for example, cathode, anode, gate, or emitter, collector, and base. Transistors, thyristors, and triacs are examples of triodes. Such triodes comprise more than one PN junction.

BRIEF SUMMARY

At least one embodiment provides a vertical semiconductor triode comprising a first layer of semiconductor material, the first layer comprising first and second surfaces, the first surface being in contact with a first electrode forming a Schottky contact.

According to at least one embodiment, the second surface is in contact with a second layer of semiconductor material to form a PN junction.

According to at least one embodiment, the triode comprises a second electrode forming a Schottky contact.

According to at least one embodiment, the first electrode is at least partially made of a first metal.

According to at least one embodiment, the second electrode is at least partially made of the first metal.

According to at least one embodiment, the first layer is of type P and the work function of the first metal is smaller than the work function of the first layer.

According to at least one embodiment, the first layer is made of silicon and the work function of the first metal is smaller than 4.5 eV.

According to at least one embodiment, the first metal is hafnium.

According to at least one embodiment, the first metal is aluminum.

According to at least one embodiment, the first layer is of type N and the work function of the first metal is greater than the work function of the first layer.

According to at least one embodiment, the first layer is made of silicon and the work function of the first metal is greater than 5 eV.

According to at least one embodiment, the first metal is platinum.

According to at least one embodiment, the first electrode comprises portions made of the first metal connected to portions of a second metal, the contact between the second metal and the first layer being an ohmic contact.

According to at least one embodiment, the second metal is aluminum.

According to at least one embodiment, the second electrode comprises portions made of the first metal connected to portions made of a third metal, the contact between the third metal and the first layer being an ohmic contact.

According to at least one embodiment, the third metal is aluminum.

According to at least one embodiment, the first layer has a first doping level, the first layer comprising portions, in contact with the second electrode, having a second doping level and being of the same doping type as the rest of the first layer.

According to at least one embodiment, the second electrode is in contact with the second surface of the first layer.

According to at least one embodiment, the triode is a bipolar transistor.

According to at least one embodiment, the triode is a triac.

According to at least one embodiment, the triode is a thyristor.

According to at least one embodiment, the first layer has a first doping level, the first layer comprising portions, in contact with the first electrode, having a second doping level and being of the same doping type as the rest of the first layer.

The foregoing and other features and advantages will be discussed in detail in the following non-limiting description of specific embodiments in connection with the accompanying drawings.

DETAILED DESCRIPTION

Figure 1:
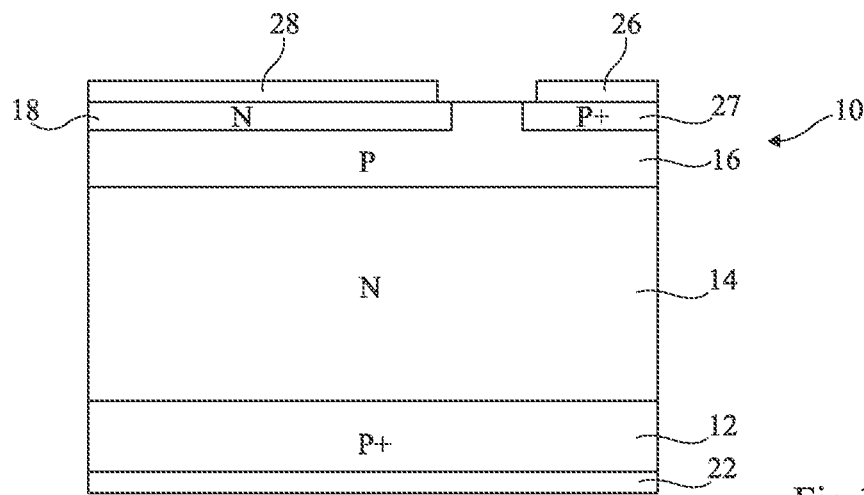
FIG. 1 schematically shows a prior art thyristor.

The same elements have been designated with the same reference numerals in the various drawings and, further, the various drawings are not to scale. For clarity, only those steps and elements which are useful to the understanding of the described embodiments have been shown and are detailed. In particular, the peripheral elements of the semiconductor components are not detailed.

In the following description, when reference is made to terms qualifying the absolute position, such as terms "left-hand," "right-hand," etc., or the relative position, such as terms "top," "upper," "lower," etc., reference is made to the orientation of the concerned elements in the drawings. The terms "approximately" and "substantially" are used herein to designate a tolerance of plus or minus 10%, preferably of plus or minus 5%, of the value in question.

Vertical components, that is, components having their different semiconductor layers located on top of one another, are here considered.

FIG. 1 schematically shows an example of a prior art thyristor 10. In the example of FIG. 1, thyristor 10 comprises a first layer 12 of P-type doped semiconductor material (P+) forming the anode. Thyristor 10 comprises a second layer 14 of N-type doped semiconductor material covering and being in contact with an upper surface of first layer 12. There thus is a PN junction between the first and second layers. Thyristor 10 comprises a third layer 16 made of P-type doped semiconductor material covering and in contact with the upper surface of second layer 14. There thus is a PN junction between the second and third layers. Third layer 16 forms the gate. Third layer 16 is less heavily doped than first layer 12. Thyristor 10 further comprises a fourth layer 18, which may be continuous or divided into a plurality of portions and being formed by implanting N-type dopants into third layer 16. There thus is a PN junction between the third and fourth layers. Fourth layer 18 forms the cathode.

Metal layers form an anode electrode 22, in contact with the lower surface of first layer 12, a gate terminal 26, in contact with a portion 27 of third layer 16 more heavily doped than the rest of third layer 16, and a cathode electrode 28, in contact with fourth layer 18. The contact between each terminal or electrode and the corresponding layer of semiconductor material is an ohmic contact.

An ohmic contact corresponds to a metal layer in contact with a semiconductor material, the metal layer having, if the semiconductor material is of type N, a work function smaller than that of the semiconductor material and, if the semiconductor material is of type P, a work function greater than the work function of the semiconductor material.

Variations can be observed in the behavior of thyristors which have been simultaneously formed in a same plate. For example, variations of electric characteristics such as the value of the turn-on current or the value of the hold current can be observed from one thyristor to another on a same plate. Such variations are at least partially caused by the method of forming fourth layer 18.

Fourth layer 18 is generally formed by implantation of phosphoryl trichloride ($POCl_3$) at a concentration greater than $10^{20}$ atoms/cm$^3$, followed by a diffusion anneal. The temperature is generally not homogeneous in the equipment used for the deposition, which causes variations in the doping profile. Further, the forming of chemical complexes from the oxygen of phosphoryl trichloride causes variations in the lifetime of charge carriers.

Figure 2:
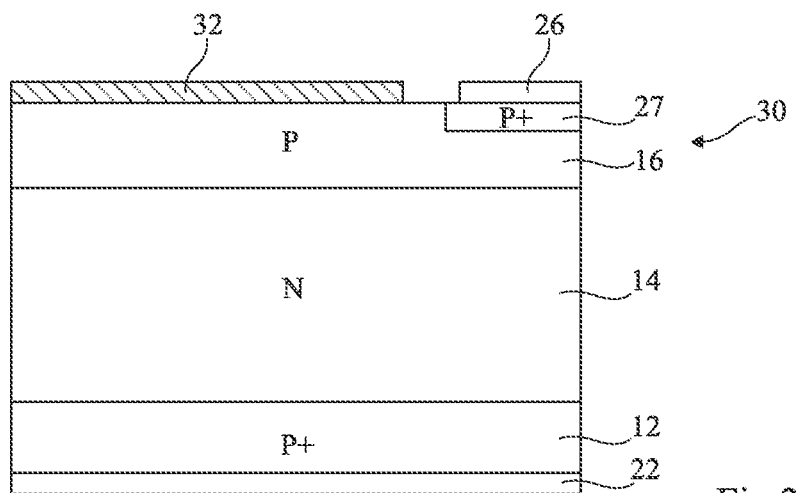
FIG. 2 shows an embodiment of a thyristor.

FIG. 2 shows an embodiment of a thyristor. FIG. 2 shows a thyristor 30 where fourth layer 18 has not been formed in third layer 16. FIG. 2 comprises elements similar to the elements of FIG. 1 designated with the same reference numerals. These elements are not detailed again.

The cathode electrode of thyristor 30, formed of a metal layer 32, forms a Schottky contact with the semiconductor material of the third layer 16. The Schottky contact replaces the prior art PN junction between the third and fourth layers with a Schottky metal/semiconductor junction.

Indeed, a Schottky contact corresponds to a metal layer in contact with a semiconductor material, the metal layer having, if the semiconductor material is of type N, a work function greater than that of the semiconductor material and if the semiconductor material is of type P, a work function smaller than the work function of the semiconductor material. The main charge carriers of the semiconductor material (electrons for an N-type semiconductor material and holes for a P-type semiconductor material) displace from the semiconductor material to the metal.

Thyristor 30 thus comprises three junctions and its behavior is similar to that of the prior art thyristor. Thyristors such as thyristor 30 are however not subject to variations of electric characteristics caused by the diffusion of dopants of fourth layer 18.

Figure 3:
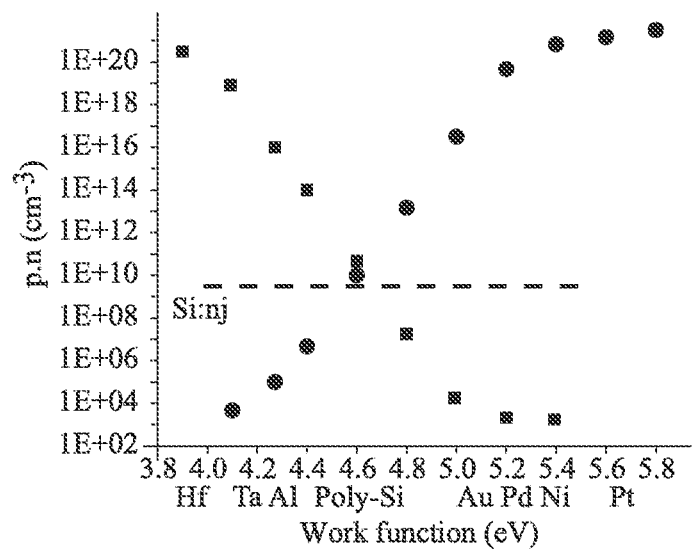
FIG. 3 shows the concentration of charge carriers under a Schottky contact for electrodes made of different metals.

FIG. 3 shows the charge carrier concentration in the portion of a semiconductor substrate directly under and in contact with a metal layer forming a Schottky contact, according to the work function of the metal, for a P-type substrate (square) and an N-type substrate (circles).

It can be observed in FIG. 3 that, for a P-type substrate (squares), the lower the work function of the metal, the higher the electron concentration in the area directly under the metal. For example, for a work function of 3.9 eV, corresponding to hafnium (Hf), the electron concentration is approximately $5.10^{20}$ cm$^{-3}$.

For an N-type substrate, the higher the work function of the metal, the greater the hole concentration in the area directly under the metal. For example, for a metal having a work function of 5.6 eV, that is, platinum (Pt), the hole concentration is approximately $5.10^{20}$ cm$^{-3}$.

This phenomenon may however be considered as problematic. However, this phenomenon here enables to do without fourth layer 18 and thus to avoid problems linked to its diffusion.

It is considered, in the following numerical examples, that first layer 12 is for example made of P-type doped silicon having a dopant concentration approximately in the range from $10^{19}$ to $5.10^{19}$ cm$^{-3}$ and having a thickness for example in the range from 2 to 5 µm. Second layer 14 is for example made of N-type doped silicon with, for example, a dopant concentration approximately equal to $10^{14}$ cm$^{-3}$ and having a thickness for example of approximately 210 µm. Third layer 16 is for example made of P-type doped silicon having a dopant concentration in the range from $10^{15}$ to $10^{16}$ cm$^{-3}$, having a thickness for example in the range from 10 to 15 µm, and having a work function approximately equal to 4.9 eV.

Metal layer 32 is made of a metal having a work function smaller than that of third layer 16. In the case considered herein, a metal having a work function smaller than 4.5 eV may for example be selected. Preferably, the selected metal is hafnium, the electron concentration of the semiconductor directly under the metal then being approximately equal to $5.10^{20}$ cm$^{-3}$, or aluminum, which is currently used (work function equal to 4.25 eV), the electron concentration of the semi-conductor directly under the metal then being approximately equal to $10^{16}$ cm$^{-3}$.

Metal layers 22 and 26, forming ohmic contacts with the layers of semiconductor material in contact therewith, are for example made of aluminum. Indeed, layers 12 and 27 being heavily doped, the ohmic contact is thus ensured by tunnel effect.

Figure 4A:
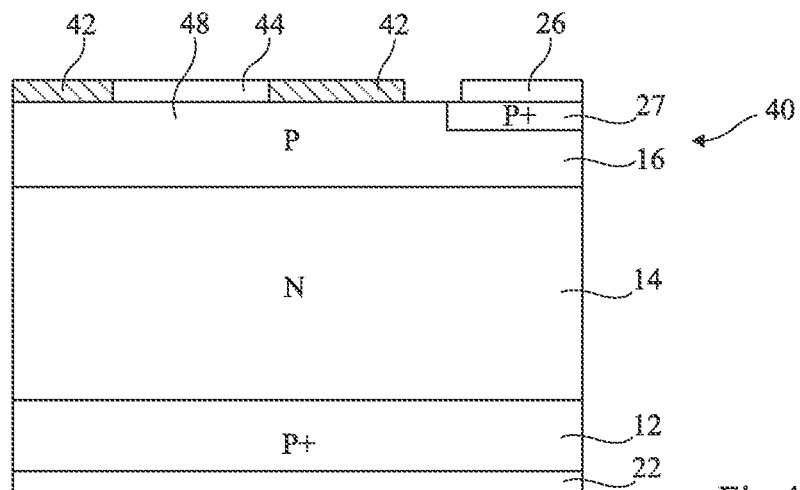
FIGS. 4A and 4B show other embodiments of thyristors.
Figure 4B:
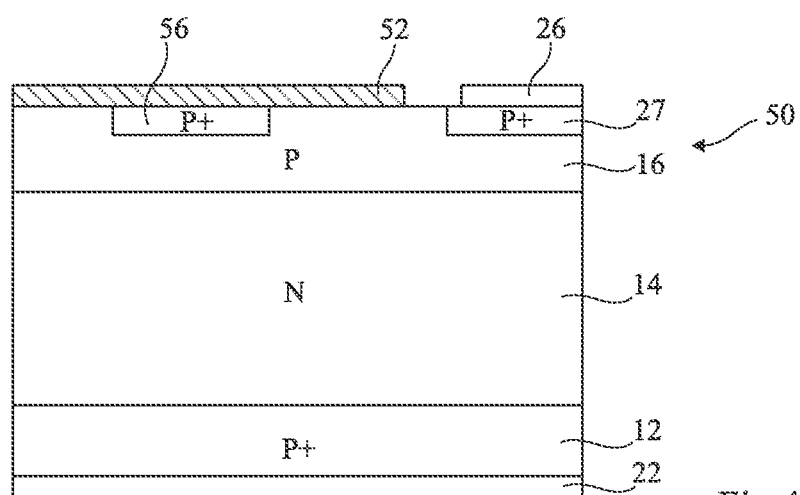

FIGS. 4A and 4B show other embodiments of thyristors where fourth layer 18 has not been formed. FIGS. 4A and 4B comprise elements similar to elements of FIG. 1 designated with the same reference numerals. These elements are not detailed again.

FIG. 4A shows a thyristor 40 having its cathode electrode formed of metal portions 42 (two of which are shown) forming Schottky contacts with the semiconductor material of third layer 16. Portions 42 are electrically connected to one another, for example, by metal portions 44 forming ohmic contacts with a portion 48 of the semiconductor material of layer 16.

FIG. 4B shows a thyristor 50 having as a cathode electrode a metal layer 52 similar to metal layer 32 of FIG. 2. Metal layer 52 covers third layer 16 including regions 56 of third layer 16. In FIG. 4B, a region 56 is shown. Regions 56 are regions which have been more heavily doped than the rest of third layer 16 before the forming of cathode electrode 52. Regions 56 for example have a doping substantially equal to the doping of portion 27 or of first layer 12. This doping difference enables to ensure the forming of an ohmic contact, by tunnel effect, between regions 56 and metal layer 52.

The cathode electrodes of FIGS. 4A and 4B are thus divided into portions forming Schottky-type metal/semiconductor junctions and portions which do not form such junctions. The cathode electrode is thus electrically connected, in places, with the semiconductor layer forming the gate without crossing a Schottky-type metal/semiconductor junction, which is not true for the cathode electrode of FIG. 2. In the case of the example of FIG. 2, metal layer 32 is continuous and forms a Schottky contact along its entire length. Thyristor 30 obtained in FIG. 2 may then be relatively sensitive, that is, for example, have a low turn-on current, for example, smaller than 100 μA, as compared with those of the thyristors of FIGS. 4A and 4B.

Layers 42 (FIG. 4A) and 52 (FIG. 4B) are for example, like layer 32 of FIG. 2, made of a metal having a work function smaller than that of third layer 16. In the previously-described numerical case, a metal having a work function smaller than 4.5 eV may for example be selected. Preferably, the selected metal is hafnium, or aluminum.

Portions 44 (FIG. 4A) are for example made of aluminum, like layers 22 and 26 of FIG. 2.

Figure 5:
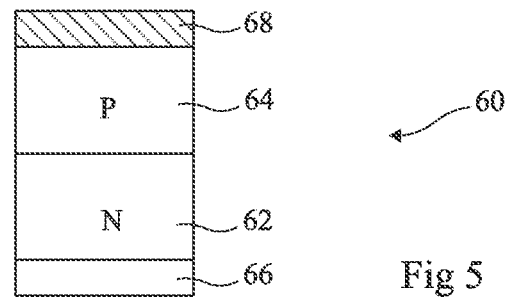
FIG. 5 shows an embodiment of a bipolar transistor.

FIG. 5 shows an embodiment of a vertical bipolar transistor 60. A prior art vertical bipolar transistor generally comprises three layers of semiconductor material located above one another to form two PN junctions.

According to the embodiment of FIG. 5, transistor 60 comprises two layers 62 and 64 of semiconductor material. N-type doped layer 62 forms the emitter or the collector and is in contact by its upper surface with the lower surface of P-type doped layer 64 and forming the base.

The lower surface of layer 62 is in contact with a metal layer 66. Metal layer 66 and semiconductor material layer 62 form an ohmic contact.

A metal layer 68 forms a Schottky contact (a Schottky-type metal/semiconductor junction) with semiconductor material layer 64. Layer 68 forms the collector or emitter electrode of transistor 60.

Transistor 60 thus effectively comprises two junctions forming a collector and an emitter separated by a base.

Figure 6A:
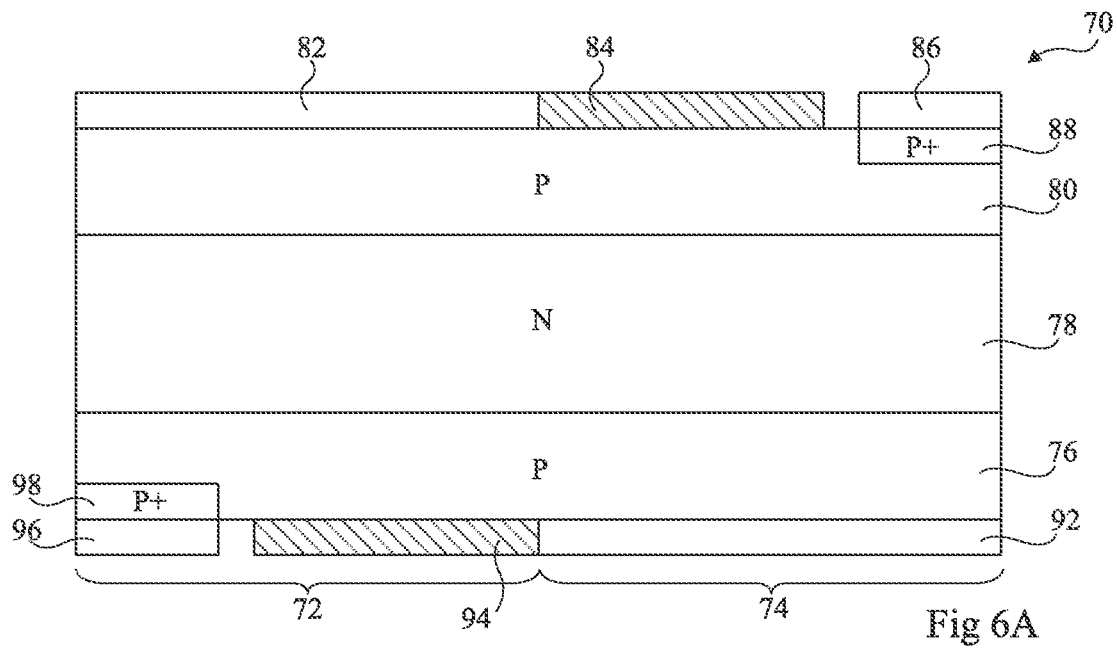
FIGS. 6A to 6C show embodiments of triacs.
Figure 6B:
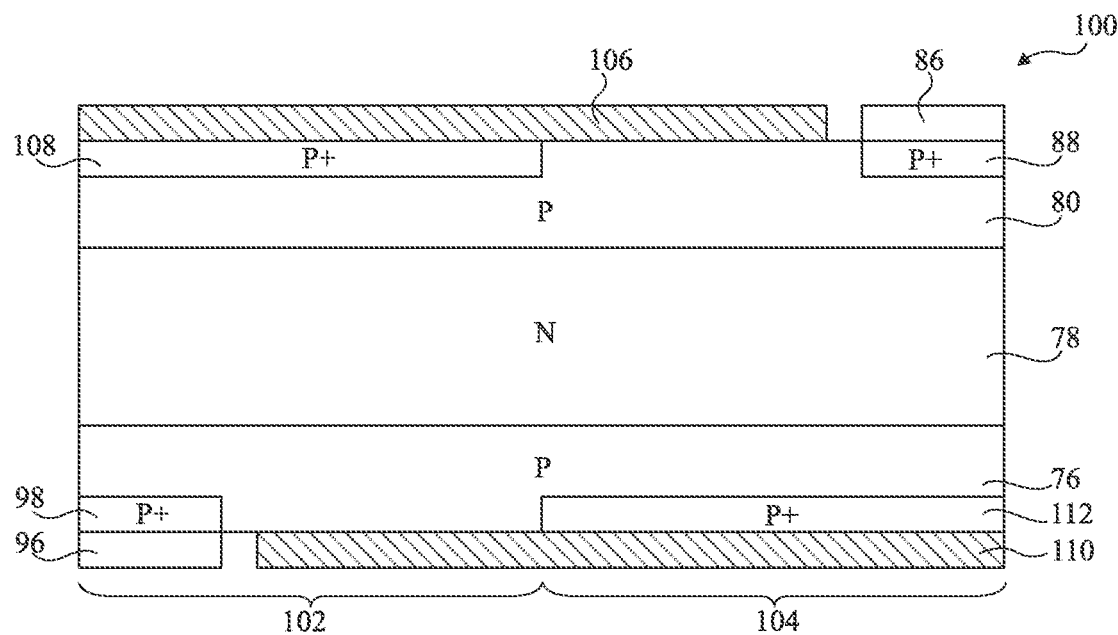
Figure 6C:
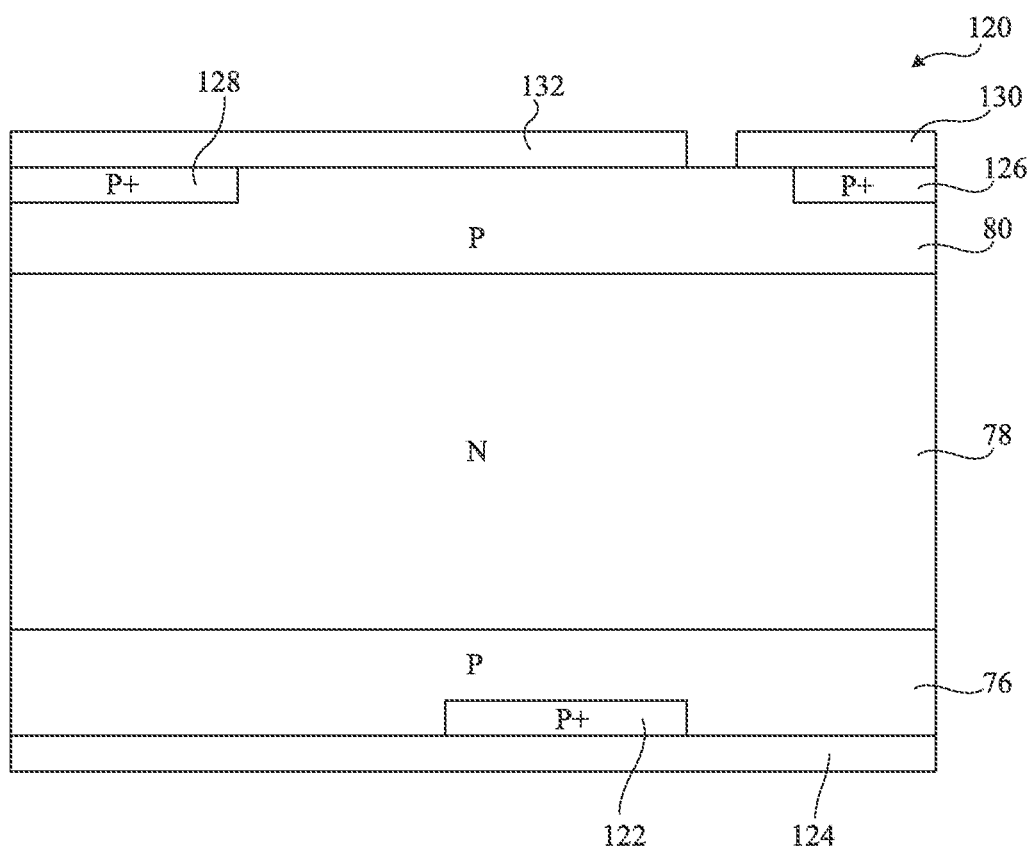

FIGS. 6A to 6C each show an embodiment of two head-to-tail thyristors forming a triac.

FIG. 6A shows a triac 70 comprising a thyristor 72, on the left-hand side, and a thyristor 74, on the right-hand side. The cathode of each thyristor 72 and 74 is formed like that of the thyristor of FIG. 2.

Triac 70 comprises an N-type semiconductor substrate 78, common to the two thyristors 72 and 74. The lower surface of substrate 78 is in contact with a layer 76 of P-type doped semiconductor material, forming the gate of thyristor 72 and the anode of thyristor 74. The upper surface of substrate 78 is in contact with a layer 80 of P-type semiconductor material, forming the anode of thyristor 72 and the gate of thyristor 74.

The upper surface of layer 80 is covered on its left-hand portion with a metal layer 82 forming an ohmic contact with layer 80 and forming the anode electrode of thyristor 72. The upper surface of layer 80 is partially covered, on the right-hand side, with a layer 84 of metal forming a Schottky contact with layer 80 and forming the cathode electrode of thyristor 74. The upper surface of layer 80 is also partially covered with a metal layer 86 forming an ohmic contact with a portion 88 of layer 80 more heavily P-type doped than the rest of layer 80. Layer 86 forms the gate contact of thyristor 74. Layer 84 is electrically connected to layer 82, for example, by direct contact, and electrically insulated from layer 86.

Similarly, the lower surface of layer 76 of semiconductor material is covered, on the right-hand side, with a metal layer 92 forming an ohmic contact with semiconductor material layer 76 and forming the anode electrode of thyristor 74. The lower surface of layer 76 is, on the left-hand side, partially covered with a metal layer 94 forming a Schottky contact with layer 76 and forming the cathode electrode of thyristor 72. The lower surface of layer 76 is also covered with a metal layer 96 forming an ohmic contact with a portion 98 of layer 76 more heavily P-type doped than the rest of layer 76. Layer 96 forms the gate terminal of thyristor 72. Layer 94 is electrically connected to layer 92, for example, by direct contact, and electrically insulated from layer 96.

Thus, layer 82 and layer 84, connected to each other, form a terminal of triac 70, and layers 92 and 94, connected to each other, form the second terminal of triac 70, and layers 86 and 96 form the gate terminals.

FIG. 6B shows a triac 100. FIG. 6B comprises elements similar to elements of FIG. 6A which will be designated with the same reference numerals and will not be detailed again.

Triac 100 comprises a metal layer 106 replacing metal layers 82 and 84. The metal of layer 106 is the same metal as the metal of layer 84. The region 108 of layer 80 located, on the left-hand side, under the portion of layer 106 replacing layer 82, is more heavily P-type doped than the rest of layer 80.

Similarly, layers 92 and 94 are replaced with a single metal layer 110 made of the same metal as layer 94. Region 112 of layer 76 under the right-hand portion of layer 110 is more heavily P-type doped than the rest of layer 76.

As a variation, the cathode of the thyristors of FIGS. 6A and 6B may be formed like the cathode of the thyristor of FIG. 4A or that of FIG. 4B, that is, divided into portions.

FIG. 6C shows an embodiment of a triac 120. FIG. 6C comprises elements similar to elements of FIGS. 6A and 6B which will be designated with the same reference numerals and will not be detailed again.

Triac 120 comprises substrate 78 (of type N) and previously-described layers 76 (of type P) and 80 (of type P).

Layer 76 comprises, on its lower surface side, a P-type doped area 122 (P+) more heavily doped than the rest of layer 76.

An electrode 124 covers the lower surface of layer 76. Electrode 124 forms, with area 122, an ohmic contact and, with the rest of layer 76, a Schottky-type metal/semiconductor material junction. Electrode 124 corresponds to the anode electrode of triac 120.

Layer 80 comprises, on its upper surface side, P-type doped areas (P+) 126 and 128, more heavily doped than the rest of layer 80.

An electrode 130 covers area 126 and a portion of the rest of layer 80. Electrode 130 forms, with area 126, an ohmic contact and, with the rest of layer 80, a Schottky-type metal/semiconductor material junction. Electrode 130 corresponds to the gate terminal of triac 120.

An electrode 132 covers area 128 and a portion of the rest of layer 80. Electrode 132 forms, with area 126, an ohmic contact and, with the rest of layer 80, a Schottky-type metal/semiconductor material junction. Electrode 132 corresponds to the cathode electrode of triac 120.

The possible materials for electrodes 124, 130, and 132 are the same as for previously-described electrodes 68, 84, 94, 106, or 110.

In the case where the doping types of the various previously-described components are inverted, that is, the semiconductor material with which the Schottky contact is formed is of type N, the different embodiments remain applicable. The metal of the Schottky contact is then selected to have a work function greater than the work function of the N-type doped semiconductor material of the Schottky contact. The metal of the Schottky contact is then for example made of a metal having a work function greater than 5 eV, for example, platinum, having a work function approximately equal to 5.6 eV.

An advantage of the embodiments described herein is that the manufacturing method comprises one less doping step, since the doping of portions 56, 108, or 128 may be performed during the doping of portions 27, 88, or 126.

Specific embodiments have been described. Various alterations, modifications, and improvements will occur to those skilled in the art. More specifically, in the case of a transistor, layer 62 might not be present. In this case, layer 64 then forming the substrate is in contact, on each side, with an electrode forming a Schottky-type metal/semiconductor material junction.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a first semiconductor layer having a first surface and a second surface opposite to the first surface, the first semiconductor layer having a P doping type at the first and second surfaces;
    a second semiconductor layer in contact with the second surface, the second semiconductor layer having an N doping type;
    a PN junction at the second surface and the second semiconductor layer;
    a first electrode in contact with the first surface only at a first region of the first surface, the first region having only the P doping type, the first region having a first doping level of the P-doping type; and
    a second electrode in contact with the first surface only at a second region of the first surface, the second region abuts the first region, the second region having only the P doping type, the second region having only a second doping level of the P-doping type greater than the first doping level.

2. The device of claim 1, further comprising:
    a third semiconductor layer in contact with the second semiconductor layer, the third semiconductor layer spaced apart from the first semiconductor layer by the second semiconductor layer; and
    a third electrode in contact with only a third region of the third semiconductor layer, the third region of the third semiconductor layer having only the P doping type.

3. The device of claim 2, wherein the first and second electrodes are each at least partially made of a first metal.

4. The device of claim 3, wherein the first semiconductor layer is made of silicon and the work function of the first metal is smaller than 4.5 eV.

5. The device of claim 3, wherein the first metal is hafnium.

6. The device of claim 3, wherein the first metal is aluminum.

7. The device of claim 2, further comprising a fourth electrode in contact with only a fourth region of the third semiconductor layer spaced apart from the third region, the fourth region of the third semiconductor layer having only the P-doping type.

8. The device of claim 1, wherein the first electrode is at least partially made of a metal and the second semiconductor layer is of N doping type.

9. The device of claim 8, wherein the second semiconductor layer is made of silicon and the work function of the metal is greater than 5 eV.

10. The device of claim 8, wherein the metal is platinum.

11. The device of claim 1, wherein the first electrode comprises first portions made of a first metal and at least one second portion made of a second metal, at least one of the first portions being respectively connected to the at least one second portion and the first semiconductor layer.

12. The device of claim 1, wherein the first region includes a first doped area having the first doping level of the P-type doping and a second doped area having the second doping level greater than the first doping level, the first doped area of the first region abuts the second doped area of the first region.

13. The device of claim 1, wherein the first region has a first doping level and the second region has a second doping level greater than the first doping level.

14. The device of claim 1, wherein the first semiconductor layer has only the P-doping type entirely along the first surface.

15. A device comprising:
    a first semiconductor layer having first and second surfaces, the first semiconductor layer having a first doping type at the first and second surfaces;
    a second semiconductor layer in contact with the second surface;
    a first PN junction between the first semiconductor layer and the second semiconductor layer;
    a third semiconductor layer in contact with the second semiconductor layer;
    a second PN junction between the second semiconductor layer and the third semiconductor layer;
    a first electrode in contact with the first surface only at a first region of the first surface, the first region having only the first doping type at a first concentration;
    a second electrode in contact with a second region the first surface only at a second region of the first surface, the second region having only the first doping type at a second concentration that is different from the first concentration, the second region abuts the first region; and
    a third electrode in contact with the third semiconductor layer at a third region of the third semiconductor layer, the third region having the first doping type.

16. The device of claim 15, further comprising a fourth electrode in contact with a fourth region of the third semiconductor layer spaced apart from the third region, the fourth region of the third semiconductor layer having the first doping type.

17. The device of claim 15, wherein the first surface includes only the first doping type entirely along the first surface.

18. A device comprising:
    a first semiconductor layer having first and second surfaces, the first and second surfaces having only a P doping type;
    a second semiconductor layer in contact with the second surface to form a first PN junction;

a third semiconductor layer in contact with the second semiconductor layer to form a second PN junction;

a first electrode in contact with the first surface only at a first region of the first surface, forming a first Schottky contact, the first region having only the P doping type, the first region including a first doping level;

a second electrode in contact with the third semiconductor layer, forming a second Schottky contact, the third semiconductor layer having only a P doping type; and a third electrode in contact with the first surface only at a second region of the first surface, forming a first ohmic contact, the second region having only the P doping type, the second region abuts the first region, and the second region having only a second doping level different from the first doping level.

19. The device of claim 18, further comprising:

a fourth electrode in contact with the third semiconductor layer, the fourth electrode and the third semiconductor layer forming a second ohmic contact.

20. The device of claim 18, wherein the first surface of the first semiconductor layer includes only the P-doping type entirely along the first surface.

\* \* \* \* \*